United States Patent
Kato et al.

(10) Patent No.: US 6,635,310 B1
(45) Date of Patent: Oct. 21, 2003

(54) METHOD OF HEAT TREATMENT

(75) Inventors: Hitoshi Kato, Kitakami (JP); Yoshiyuki Fujita, Esashi (JP); Yukio Tojo, Sagamihara (JP); Toshitake Tsuda, Sagamihara (JP)

(73) Assignee: Tokyo Electron Limited, Tokyo-To (JP)

( * ) Notice: Subject to any disclaimer, the term of this patent is extended or adjusted under 35 U.S.C. 154(b) by 129 days.

(21) Appl. No.: 09/830,334

(22) PCT Filed: Aug. 24, 2000

(86) PCT No.: PCT/JP00/05699

§ 371 (c)(1),
(2), (4) Date: Apr. 26, 2001

(87) PCT Pub. No.: WO01/17003

PCT Pub. Date: Mar. 8, 2001

(30) Foreign Application Priority Data

Aug. 27, 1999 (JP) ............................. 11-242303
Jan. 21, 2000 (JP) ........................ 2000-013532

(51) Int. Cl.⁷ ............................................. C23C 16/22
(52) U.S. Cl. ............................. 427/255.38; 427/255.29; 427/376.1

(58) Field of Search ..................... 427/255.38, 255.393, 427/255.27, 255.29, 376.1

(56) References Cited

U.S. PATENT DOCUMENTS

| | | | | | |
|---|---|---|---|---|---|
| 4,939,103 A | * | 7/1990 | Szolgyemy | .................. | 437/151 |
| 5,352,636 A | * | 10/1994 | Beinglass | ................... | 437/235 |
| 5,498,578 A | * | 3/1996 | Steele et al. | ................ | 438/400 |

FOREIGN PATENT DOCUMENTS

| | | |
|---|---|---|
| JP | 3-272165 | 12/1991 |
| JP | 9-8005 | 1/1997 |
| JP | 10-275901 | 10/1998 |
| JP | 11-204450 | 7/1999 |
| JP | 2000-58779 | 2/2000 |

* cited by examiner

*Primary Examiner*—Bret Chen
(74) *Attorney, Agent, or Firm*—Smith, Gambrell & Russell, LLP

(57) ABSTRACT

A thermal processing method of the invention includes; a loading step of loading an object to be processed into a processing container, the object having a surface provided with a silicon film having a minutely irregular profile; and a doping step of introducing phosphorus atoms in the silicon film as impurities, by using $PH_3$ gas as a doping gas while maintaining a temperature of 550 to 750° C.

8 Claims, 11 Drawing Sheets

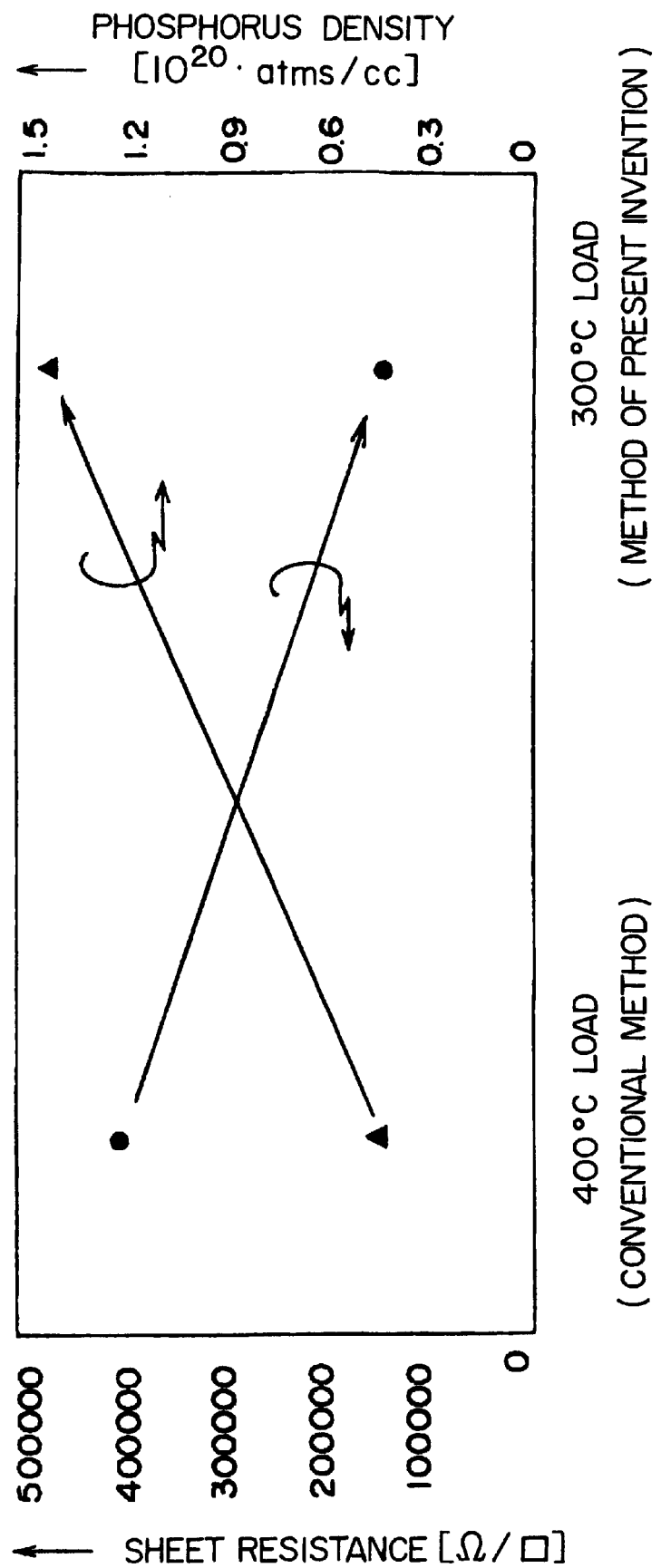
F I G. 5

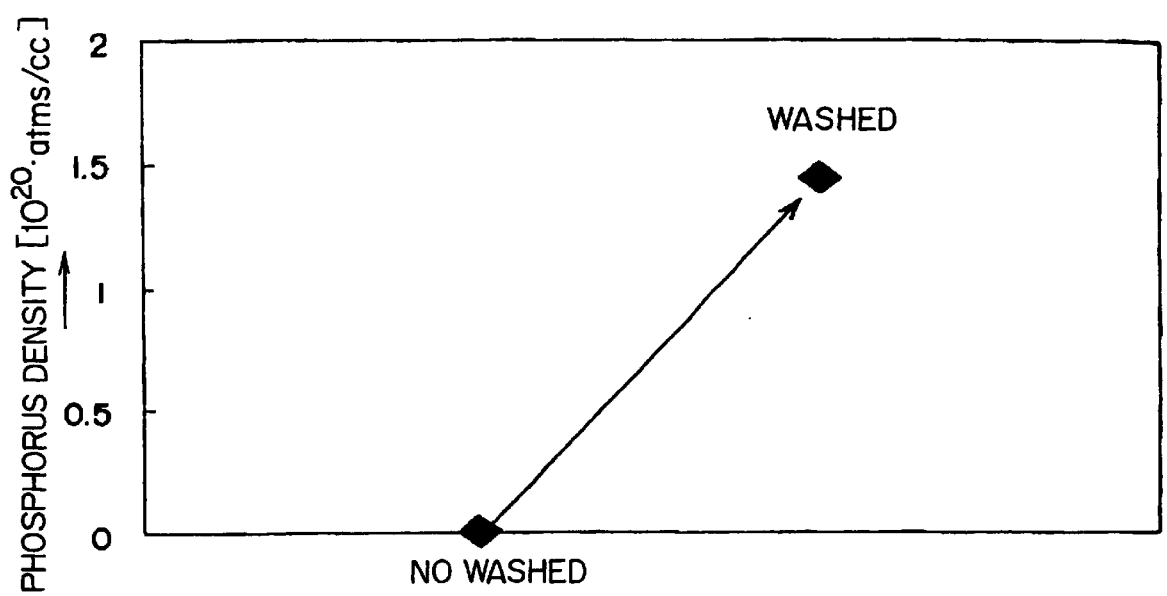
F I G. 6

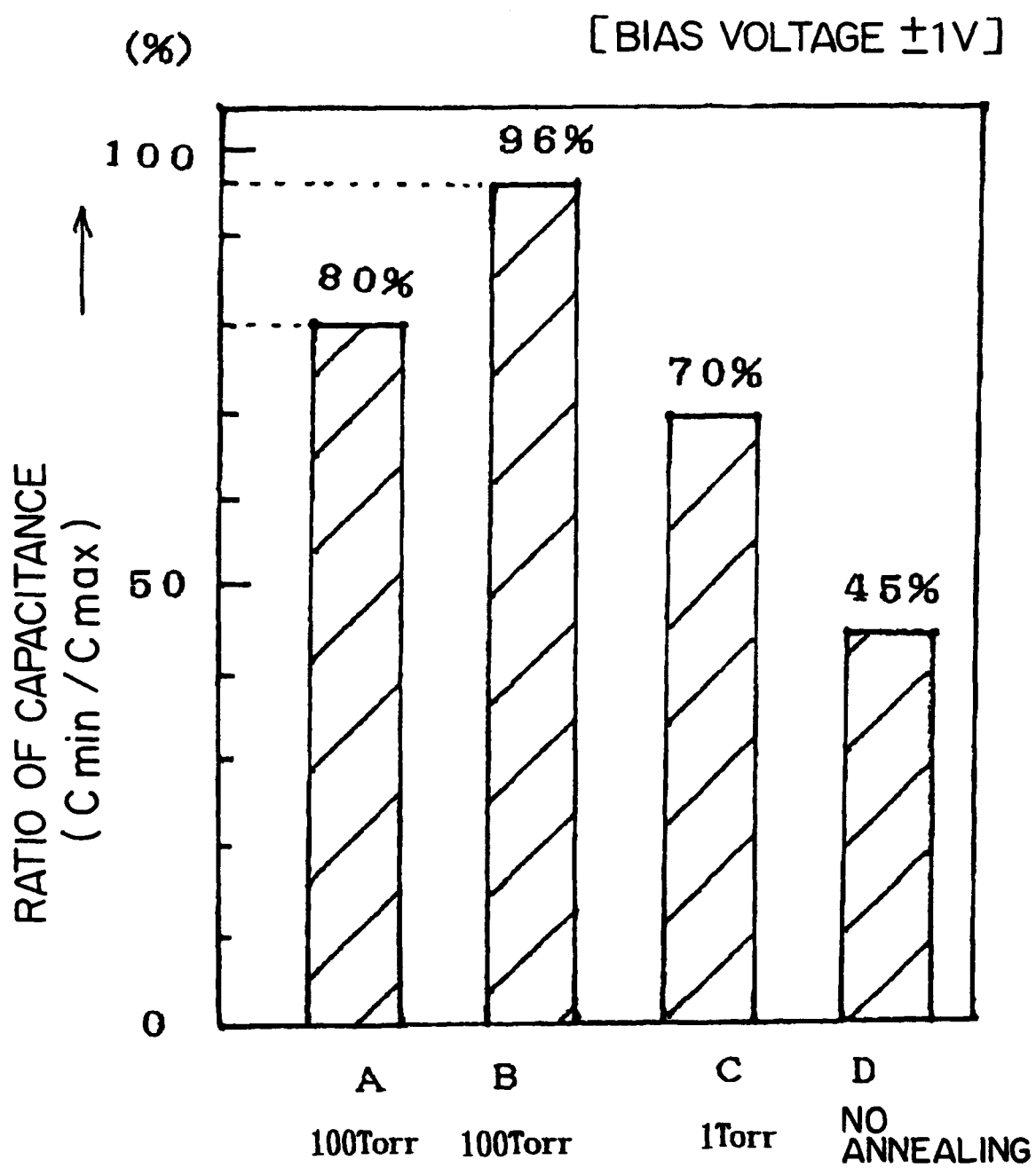
F I G. 8

METHOD OF HEAT TREATMENT

FIELD OF THE INVENTION

This invention relates to a thermal processing method for conducting a thermal process to a semiconductor wafer or the like, n particular to a thermal processing method suitable for used n forming electrodes of a capacitor.

BACKGROUND OF THE INVENTION

In general, in order to form a semiconductor integrated circuit such as an IC, desired transistors, resistors, capacitors and so on are formed integratedly in a high density by repeating a film-forming process, an etching process, a thermal diffusion process, an oxidation process or the like to a surface of a semiconductor wafer or a glass substrate many times.

Recently, especially, because of a higher integration of a semiconductor unit, each element itself tends to become more minute. For example, in a storing unit such as a DRAM, an area that each cell occupies tends to become smaller and smaller. In order to ensure enough capacitance even if the area becomes smaller, it is enough to make thin a thickness of an insulation layer between capacitor electrodes or to increase a dielectric constant of the insulation layer. However, if the thickness of the insulation layer is made thinner, insulation performance thereof may be deteriorated. In addition, there are various technical problems in making the material higher dielectric.

Thus, a poly-silicon film whose surface has a minutely irregular profile is formed on a surface of an electrode of a capacitor, in order to double or triple a substantial area of the surface that contributes to capacitance. Methods for forming the poly-silicon film whose surface has the irregular profile are for example shown in JP-A-5-304273 and JP-A-7-221034. That is, they are a method of selectively forming an HSG (Hemispherical Grained) poly-silicon film having an irregular surface profile by causing silicon-nucleic crystal to grow up on a surface of a non-doped amorphous silicon film, and a method of directly depositing a Rugged poly-silicon film having an irregular surface profile on an entire surface of a wafer by setting a certain film-forming condition and then selectively etching it in order to form the poly-silicon film only at predetermined portions.

Herein, there is briefly explained a method of forming a poly-silicon film whose surface has an irregular profile such as an HSG poly-silicon film or a rugged poly-silicon film to a desired portion such as an electrode of a capacitor.

FIG. 9 is a process chart for forming an HSG poly-silicon film as a poly-silicon film whose surface has an irregular profile.

In FIG. 9A, a channel stopper 2, a source 4 and a drain 6 are formed on a surface of a semiconductor wafer W consisting of for example a silicon wafer. On surfaces thereof, a layer insulation film 8 consisting of $SiO_2$ is formed, which may be deposited by using TEOS or the like. A gate electrode 10 is buried in the layer insulation film 8 at a portion between the source 4 and the drain 6. In addition, a bit line 12 is connected to the drain 6. The source 4 is connected to a lower electrode 14 that is formed so as to fulfill a contact hole extending through the layer insulation film 8. An upper end of the lower electrode 14 is formed into a cylindrical circular shape, which enables to make a stack capacitor. For example, the lower electrode 14 is made of a phosphorus-doped amorphous silicon film in which phosphorus atoms have been doped.

Then, in the semiconductor wafer W formed as shown in FIG. 9A, as shown in FIG. 9B, a non-doped amorphous silicon film 16 is selectively formed on the surface of the lower electrode 14. In addition, by causing migration by a thermal process under a higher vacuum, silicon-core crystal is selectively formed only on the non-doped amorphous silicon film 16. Furthermore, as shown in FIG. 9C, the core crystal is caused to grow up by atoms in the non-doped amorphous silicon film 16 moving. Thus, the HSG silicon film 18 whose surface has the irregular profile is formed. Herein, sillan or disilane is used as a process gas. A process temperature is for example about 500 to 600° C. Regarding a process pressure, for example when the sillan is used, a partial pressure is $2 \times 10^{-3}$ Torr ($2.66 \times 10^{-1}$ Pa) or less.

FIG. 10 is a process chart for forming a rugged poly-silicon film as a poly-silicon film whose surface has an irregular profile. A state shown in FIG. 10A is the same as that shown in FIG. 9A. From the state, as shown in FIG. 10B, a rugged poly-silicon film 20 whose surface has an irregular profile is directly caused to deposit on an entire surface of the semiconductor wafer W by a predetermined film-forming process. In the case, the rugged poly-silicon film 20 is deposited on the entire surface of the wafer. After that, by a pattern etching process, as shown in FIG. 10C, the rugged poly-silicon film 20 at unnecessary portions is removed so that the rugged poly-silicon film 20 only on the surface of the lower electrode 14 is left.

As shown in FIGS. 9 and 10, after the HSG poly-silicon film 18 whose surface has the irregular profile or the rugged poly-silicon film 20 whose surface has the irregular profile is formed on the surface of the lower electrode 14, an annealing process is conducted at a predetermined temperature. Thus, phosphorus atoms diffuse from the lower electrode 14 being a lower phosphorus-doped amorphous silicon film to the core poly-silicon film 18 or 20. Thus, the core poly-silicon film 18 or 20 becomes a part of the lower electrode. Therefore, the surface area of the lower electrode 14 can be substantially enlarged because of irregularity of the surface of poly-silicon film 18 or 20 in which phosphorus has been doped as described above.

After that, as shown in FIG. 11, a capacitance insulating film 22 consisting of $SiO_2$ or the like is formed on a surface side of the lower electrode 14. Then, a capacitor is formed by making a patterning-processed upper electrode 24.

Herein, in order to cause the HSG poly-silicon film 18 or the rugged poly-silicon film 20 to sufficiently serve as the part of the lower electrode, an enough amount of phosphorus atoms has to be diffused and doped from the lower electrode 14 being the lower phosphorus-doped amorphous silicon film. If the diffusions of the phosphorus atoms are not enough, a depletion layer may be generated, which may cause reduction of the capacitance. A state of the case is shown in FIG. 12. FIG. 12 is a graph showing a capacitance change when positive and negative voltages are applied to the capacitor produced as described above. As clearly seen from the graph, the capacitance remarkably reduces when the voltage is negative, which is undesired in performance as the capacitor.

As a measure thereto, in the case of the HSG poly-silicon film, it may be thought to make the thickness of the film thinner. However, if the thickness is too thin, the irregularity of the surface of the HSG film can not appear. In addition, it may be also thought to increase phosphorus density in the lower electrode 14. However, if the phosphorus density is too high, it becomes difficult to form the HSG film by migration.

As another measure, ionizing phosphorus atoms and directly implanting the ionized phosphorus atoms to the silicon film 18 or 20 with an implantation unit are carried out. However, in the case, the silicon film 18 or 20 may be heavily damaged by the ion implantation. In addition, in the case of the lower electrode 14 having the complicated configuration as shown in FIGS. 9 and 10, it is difficult for the ions to reach side wall portions thereof. That is, it is difficult to implant the phosphorus atoms at even ion density.

In addition, doping phosphorus atoms in the poly-silicon film 18 or 20 is also carried out by an anneal process in a $POCl_3$ atmosphere. However, in the case, if an annealing temperature is not set at 800° C. or more, the phosphorus atoms are not doped sufficiently. However, if the semiconductor wafer itself is exposed to such a high temperature atmosphere, phosphorus density may change in a depth direction by thermal budgets, to be out from a designed value for a device.

SUMMARY OF THE INVENTION

This invention is intended to solve the above problems effectively. An object of this invention is to provide a thermal processing method that can efficiently dope phosphorus atoms into a poly-silicon film whose surface has an irregular profile so that a depletion layer is prevented from being generated.

This invention is a thermal processing method comprising: a loading step of loading an object to be processed into a processing container, the object having a surface provided with a silicon film having a minutely irregular profile; and a doping step of introducing phosphorus atoms in the silicon film as impurities, by using $PH_3$ gas as a doping gas while maintaining a temperature of 550 to 750° C.

By using $PH_3$ gas as a doping gas and by setting a temperature of the thermal process at the range of 550 to 750° C., impurity density (phosphorus density) may not change from a designed value so much because the temperature is lower than 750° C. In addition, since the temperature is not lower than 550° C., efficiency of impurity doping may be maintained high to a certain extent.

Preferably, the loading step includes a step of setting a temperature in the processing container at a temperature lower than 400° C. when loading the object to be processed into the processing container. Thus, generation of natural oxide films, which may be deposited on the silicon film of the object to be processed, can be inhibited.

Preferably, a thermal processing method further comprises a temperature raising step of raising a temperature in the processing container to a range of 550 to 750° C., between the loading step and the doping step. In the case, preferably, a thermal processing method further comprises a step of subjecting the object to be processed to a cycle-purge process, between the loading step and the temperature raising step. Thus, for example, moisture and/or gases included in a dielectric layer of the object to be processed or the like can be discharged prior to the thermal process. Then, during the thermal process, attachment of natural oxide films can be prevented.

In addition, preferably, a thermal processing method further comprises a step of supplying the doping gas into the processing container to a predetermined pressure, between the loading step and the temperature raising step. Thus, it can be prevented that re-migration of the poly-silicon film is generated and that a surface area thereof is reduced.

Preferably, the doping step includes a step of maintaining a pressure in the processing container at a range of 100 to 400 Torr. Thus, doping efficiency of phosphorus atoms can be improved.

In addition, preferably, a thermal processing method further comprises a temperature lowering step of lowering the temperature of the processing container to a predetermined temperature while continuing to supply the doping gas and maintaining a pressure in the processing container at a predetermined pressure. Thus, it can be prevented that re-migration of the poly-silicon film is generated and that a surface area thereof is reduced.

The silicon film having the minutely irregular profile may be an HSG poly-silicon film. Alternatively, the silicon film having the minutely irregular profile may be a rugged poly-silicon film.

The silicon film into which the phosphorus atoms have been introduced by the doping step may be used as for example a portion of an electrode of a capacitor.

BRIEF DESCRIPTION OF THE DRAWINGS

FIG. 5 is a graph showing phosphorus densities and sheet resistances in cases wherein a semiconductor wafer is loaded at 300° C. and wherein a semiconductor wafer is conventionally loaded at 400° C.;

FIG. 6 is a graph for evaluating effectiveness of a washing process;

FIG. 8 is a graph showing ratios of capacitance;

DESCRIPTION OF THE PREFERRED EMBODIMENT

One embodiment of a thermal processing method according to the invention is explained in detail based on attached drawings.

Figure 1:
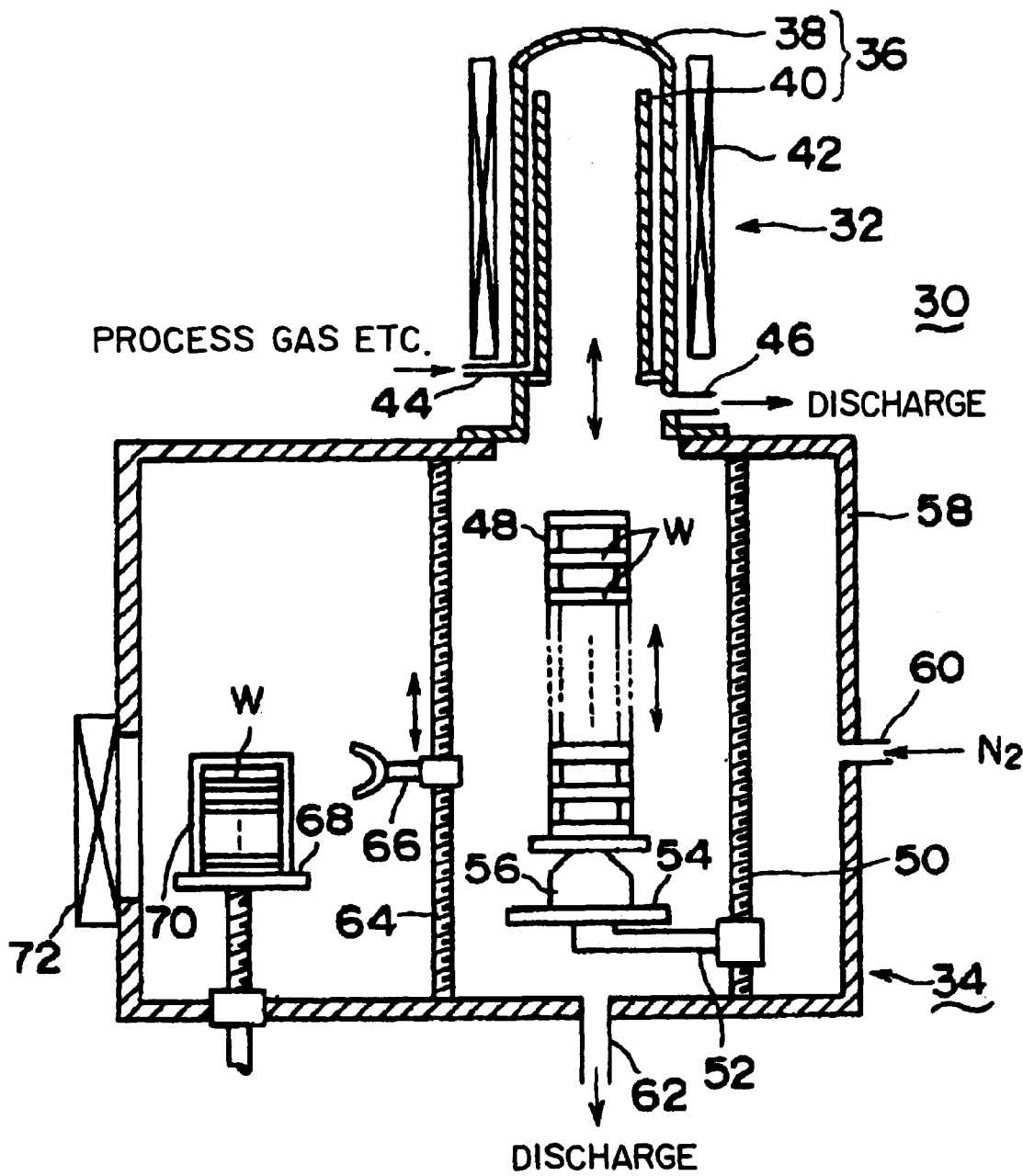
FIG. 1 is a schematic view showing an example of a thermal processing unit for carrying out a method of the invention.
Figure 2:
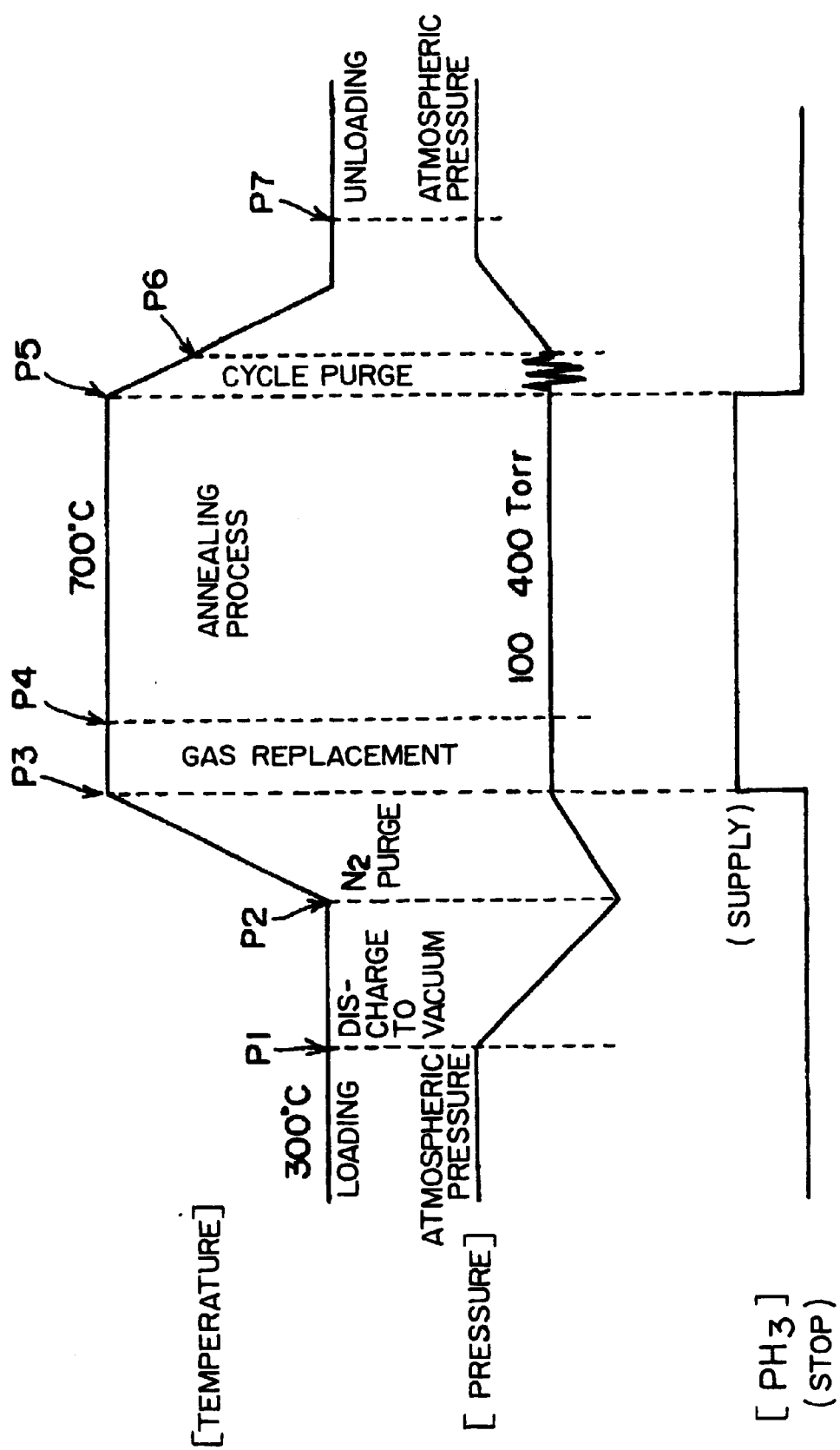
FIG. 2 is a time chart for explaining a first embodiment of a method of the invention.

FIG. 1 is a schematic view showing an example of a thermal processing unit for carrying out a method of the invention. FIG. 2 is a time chart for explaining a first embodiment of a method of the invention.

As shown in FIG. 1, the thermal processing unit 30 consists of: a longitudinal thermal processing part 32 that can conduct a thermal process at a time to a plurality of objects to be processed, for example a plurality of semiconductor wafers made from silicon substrates; and a conveying part 34 that is arranged below the thermal processing part 32 and that can convey the semiconductor wafers W into and out from the thermal processing part 32.

The thermal processing part 32 includes a processing container 36 made of heat-resistant quartz. The processing container 36 consists of an outer tube 38 whose lower end is open but whose upper end is closed by a ceiling, and an inner tube 40 having a cylindrical shape concentrically arranged in the outer tube 38 via a predetermined gap. A heater 42 is arranged outside the outer tube 38, so that the entire elements form a heating furnace. Thus, semiconductor wafers contained therein are adapted to be heated to a predetermined temperature.

A lower side wall of the processing container 36 is provided with a gas introduction port 44 for introducing a process gas into the gap between the outer tube 38 and the inner tube 40, and a discharge port 46 for sucking an atmosphere in the processing container 36 from an inside of the inner tube 40 to create a vacuum.

About 25 to 150 pieces of the semiconductor wafers W are supported by a wafer boat 48, which is made of for example crystal, at substantially the same pitch in a vertical tier-like manner. The wafer boat 48 is supported by a tip portion of the supporting arm 52, which is moved up and down by an elevating mechanism 50 including a ball screw or the like contained in the conveying part 34. In detail, the tip portion of the supporting arm 52 has a disk-like cap portion 54 that can hermetically seal a lower-end opening of the processing container 36. The wafer boat 48 is placed on the cap portion 54 via a thermal insulating tube 56 made of for example crystal. Thus, by the elevating mechanism 50 being operated, the wafer boat 48 supporting the semiconductor wafers W is adapted to be loaded into and unloaded from the processing container 36 via the lower-end opening.

A wall-box 58 of the conveying part 34 is made of for example stainless steel or the like. A side wall thereof is provided with a gas inlet 60 for introducing an inert gas such as $N_2$ thereinto. A base portion thereof is provided with a gas outlet 62 for discharging the inside atmosphere to create a vacuum.

A second elevating mechanism 64 including a ball screw or the like is arranged in the conveying part 34. The second elevating mechanism 64 is provided with a conveying arm 66 in such a manner that the conveying arm can be moved up and down. The conveying arm 66 itself can rotate, expand and retract in a horizontal direction. A stage 68 is arranged in a vicinity of the conveying arm 66 in such a manner that the stage 68 can be moved up and down. A cassette 70, which can contain a plurality of, for example about 25 semiconductor wafers W and can be hermetically sealed, is placed on the stage 68. A side wall of the box-wall 58 is provided with a gate door 72 for conveying the cassette 70 into and/or from the box-wall 58.

Next, a method of the invention that can be carried out by using the above thermal processing unit is explained.

Figure 9:
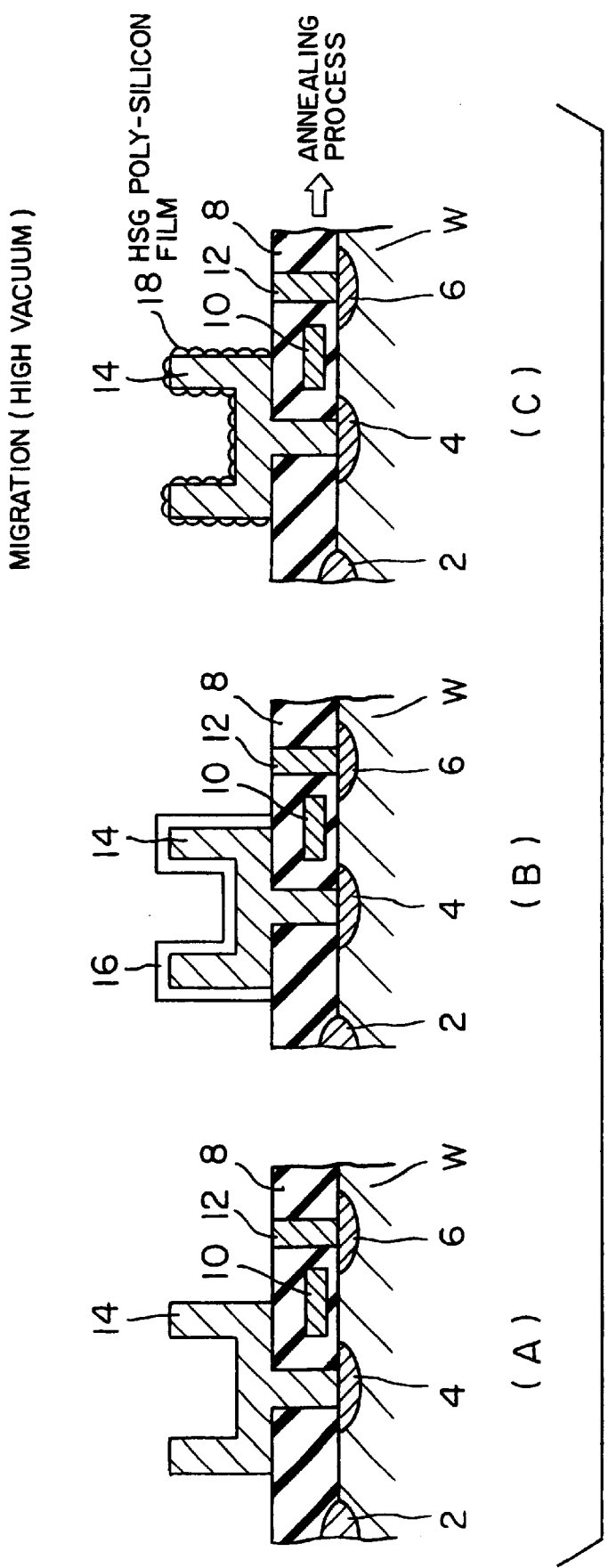
FIG. 9 is a process chart showing steps of forming an HSG poly-silicon film as a poly-silicon film whose surface has an irregular profile.
Figure 10:
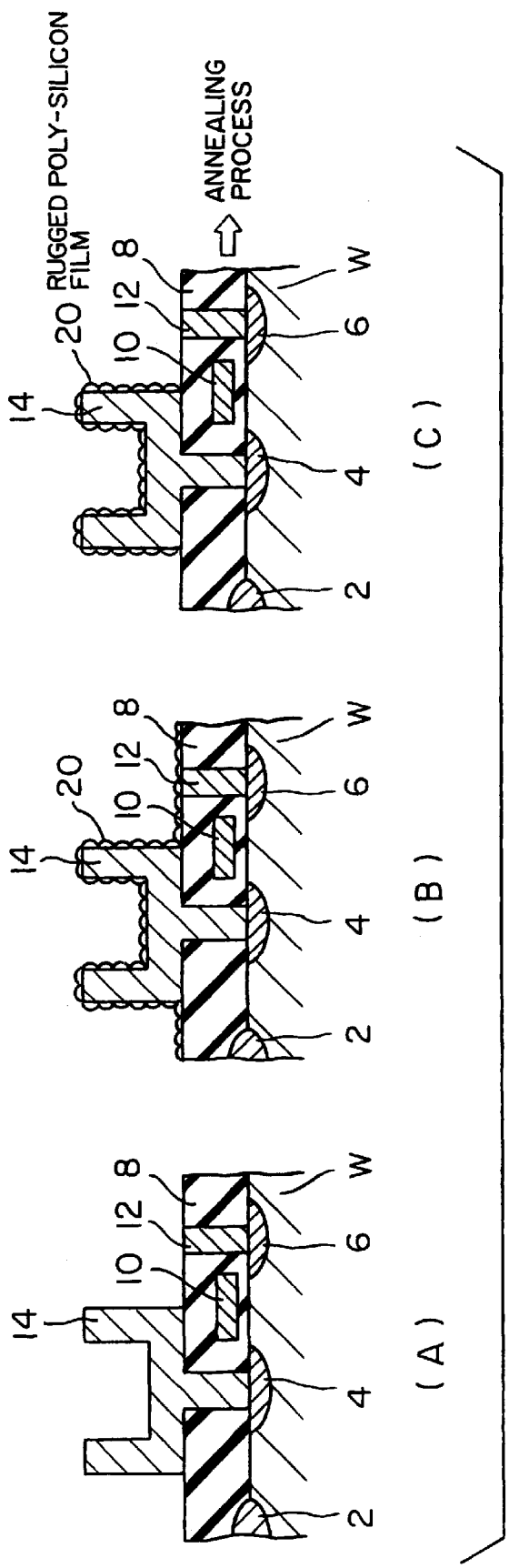
FIG. 10 is a process chart showing steps of forming a rugged poly-silicon film as a poly-silicon film whose surface has an irregular profile.
Figure 11:
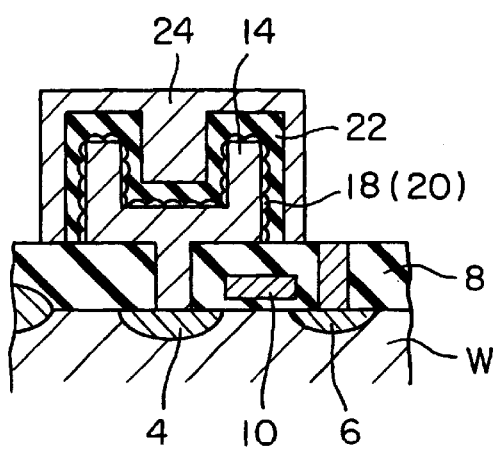
FIG. 11 is a view showing a capacitor having an upper electrode that has been formed by patterning on a capacitance insulation film.
Figure 12:
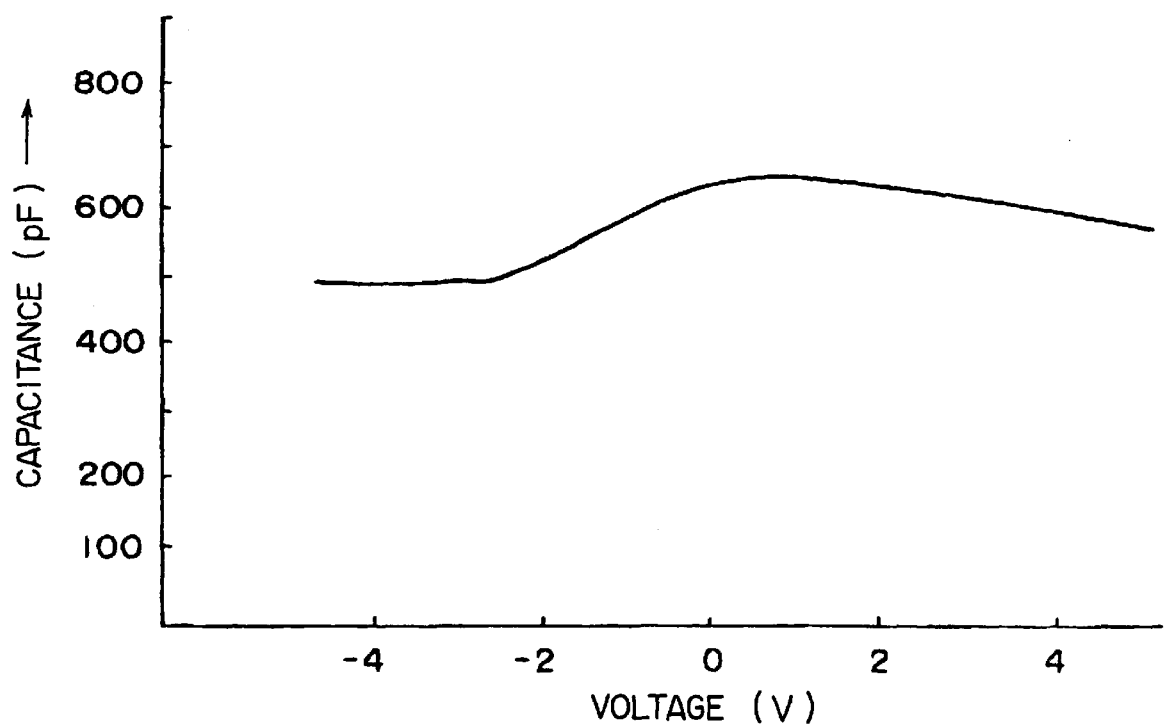
FIG. 12 is a graph showing a capacitance change when positive and negative voltages are applied to the capacitor.

At first, a general process of a semiconductor wafer W is explained. As shown in FIGS. 9C and 10C, the semiconductor wafer W, on which the silicon film 18 or 20 has been formed, is contained in the tightly-closed type of cassette 70 after a natural oxide film thereon is removed by a washing process. The cassette 70 is conveyed to the thermal processing unit 30 for an annealing process. The cassette 70 conveyed to the thermal processing unit 30 is placed on the stage 68 in the wall-box 58 of the conveying part 34, which has been filled with the inert atmosphere, via the gate door 72. Then, a lid of the cassette 70 is opened by a lid opening/closing mechanism not shown.

Then, the conveying arm 66 in the conveying part 34 is suitably expanded, retracted, rotated and moved up or down so that all the washed wafers W in the cassette 70 are conveyed in turn to the wafer boat 48 that is standing by. Then, the semiconductor wafers W are supported by the wafer boat 48 in a tier-like manner.

If all the wafers W have been conveyed, the wafer boat 48 is moved up by the elevating mechanism 50 being operated, so that the wafer boat 48 is inserted and loaded into the processing container 36, which has been previously heated to the predetermined temperature, via the lower-end opening. The lower-end opening is hermetically sealed by the cap portion 54.

After the loading operation of the wafers W is completed as described above, heat value supplied from the heater 42 is increased in order to heat the wafers W and maintain the temperature of the wafers W at a predetermined process temperature. On the other hand, $PH_3$ gas is supplied at a predetermined rate from the gas introduction nozzle 44 while the atmosphere is discharged to create a vacuum, in order to maintain an inside pressure in the processing container 36 at a predetermined process pressure, which is 100 to 400 Torr (13300 to 53200 Pa) in the case. In the state, phosphorus atoms are doped in the poly-silicon film by a thermal process i.e. an annealing process. Then, after the predetermined thermal process is completed, reverse operation with respect to the above operation is carried out in order to discharge the processed semiconductor wafers W from the conveying part 34.

Then, with reference to FIG. 2, the first embodiment of the method of the invention is explained in detail. FIG. 2 shows process temperatures, process pressures and whether PH3 gas is supplied or not, as a timing chart.

At first, the processing container 36, which is standing by, is in a low-temperature state not higher than 400° C. In the state, the wafers W are loaded (point P1). Thus, it can be prevented that natural oxide films attach on the HSG poly-silicon films or the rugged poly-silicon films on the surfaces of the wafers. In the shown example, the temperature of the processing container 36 is set at 300° C.

Next, after the wafers W are loaded into the processing container 36, the atmosphere in the processing container 36 is discharged. When the atmosphere in the container is discharged to a certain extent (point P2), $N_2$ gas is supplied into the processing container 36 in order to prevent attachment of the natural oxide films. At the same time, power supplied to the heater 42 is increased in order to raise the temperature of the wafers W to the process temperature.

Herein, the process temperature is set to a temperature lower than the temperature at an annealing process that is carried out by using $POCl_3$ (chloride phosphoryl) or the like in prior art, for example 800° C., that is, set to a temperature in a range of 550 to 750° C. In the shown example, the process temperature is set to 700° C. When the wafer temperature reaches 700° C. (point P3), supply of the $N_2$ gas is stopped. At the same time, supply of the $PH_3$ gas is started. Thus, gas replacement is carried out (point P4), then an annealing process automatically starts. In the case, if the process temperature at the annealing process is set to a value higher than 750° C., impurities that have already been doped in the wafers W further diffuse and cause the performance to deviate from a designed value. In addition, if the process temperature is lower than 550° C., the phosphorus atoms may not be doped into the poly-silicon film efficiently.

Therefore, if the process temperature at the annealing process wherein the $PH_3$ gas is used is set in the range of 550 to 750° C., the electrical designed value of the device is kept. In addition, the phosphorus atoms can be doped efficiently.

After the annealing process has been carried out for a predetermined time for doping the phosphorus atoms as described above(point P5), the supply of the $PH_3$ gas is stopped. At the same time, the temperature of the processing container 36 starts to be lowered to a waiting temperature, for example 300° C. In addition, a cycle-purge process, wherein supplying $N_2$ gas and discharging the atmosphere gas are repeated in turn, is carried out for a predetermined time (till point P6). Thus, the remaining $PH_3$ gas is discharged. Then, if the temperature of the processing container 36 reaches the waiting temperature (300° C.) and if the pressure in the processing container 36 reaches the atmospheric pressure (point P7), an unloading operation is conducted. That is, the wafers W in which the phosphorus atoms have been doped are taken out from the processing container 36. Thus, a series of annealing processes are completed.

Thus, in the first embodiment, the $PH_3$ gas is used as the process gas. The annealing process is conducted in the range of 550 to 750° C. that is lower than 800° C. at the conventional $POCl_3$ annealing process. Thus, phosphorus density may not change in a depth direction of the device by the thermal budget. In addition, the phosphorus atoms can be efficiently doped to the HSG poly-silicon films or the rugged poly-silicon films.

In addition, when the wafers W are loaded into the processing container 36, the processing container 36 is set to a temperature that is not higher than 400° C., i.e. 300° C. in the embodiment. Thus, it can be prevented that natural oxide films attach on the poly-silicon films on the surfaces of the wafers W.

The above point is explained in detail. In general, an $SiO_2$ film made of TEOS may be broadly used as a layer insulation film 8 (see FIG. 9). However, there may be much moisture in such a film. Then, during the annealing process and/or during certain periods before and after the annealing process, the moisture may go away from the $SiO_2$ film little by little and may react with the poly-silicon film to make a natural oxide film. On the other hand, regarding the poly-silicon film whose surface has been washed to remove natural oxide films thereon, hydrogen-terminal is formed at the surface of the poly-silicon film. Thus, if the hydrogen of the hydrogen-terminal does not go away, no natural oxide film may attach on the surface. Thus, before the annealing process, if the moisture or the like in the layer insulation film 8 is discharged positively under a condition wherein the hydrogen of the hydrogen-terminal of the surface of the poly-silicon film does not go away, it can be prevented that natural oxide films attach on the poly-silicon film during the annealing process or the like.

Figure 3:
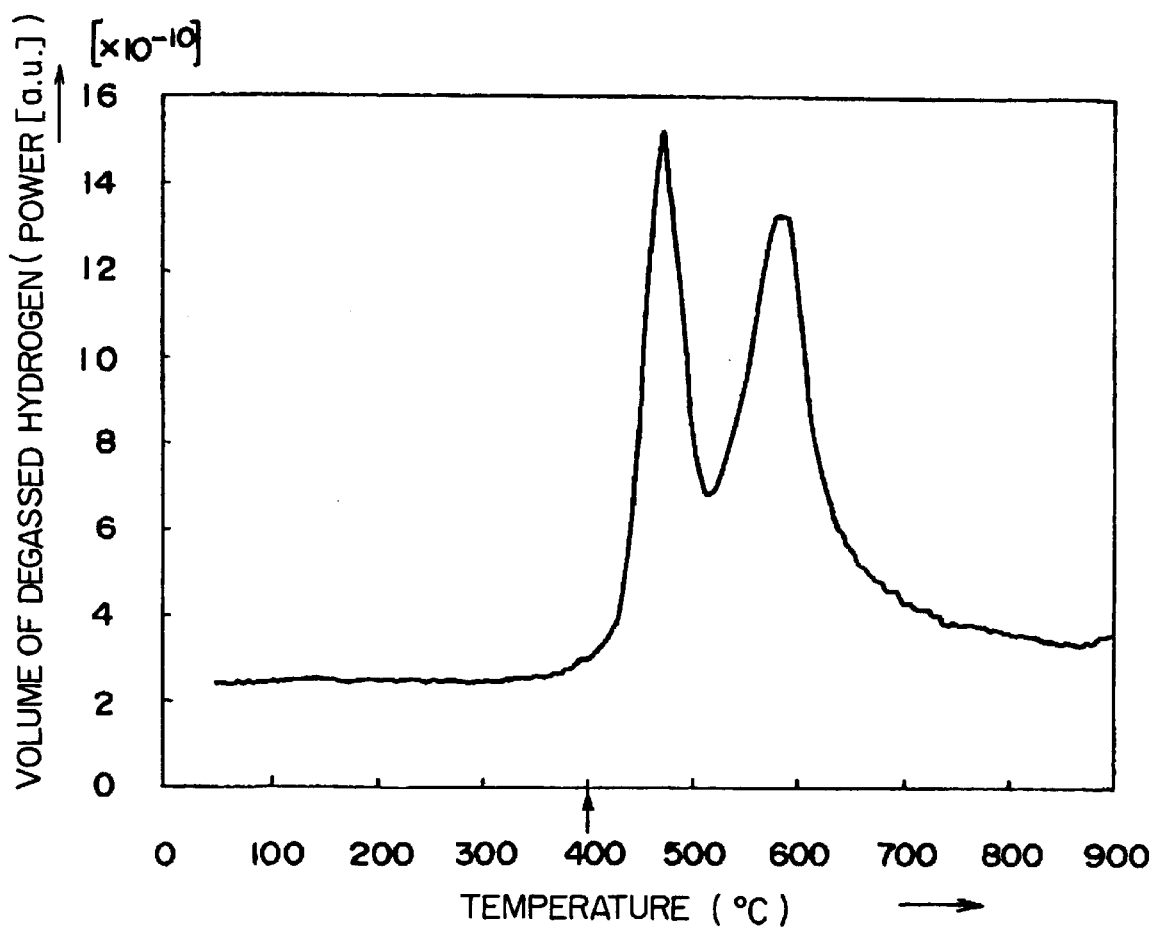
FIG. 3 is a graph showing temperature-dependency of volumes of hydrogen that has left a surface of an HSG poly-silicon film or a rugged poly-silicon film.
Figure 4:
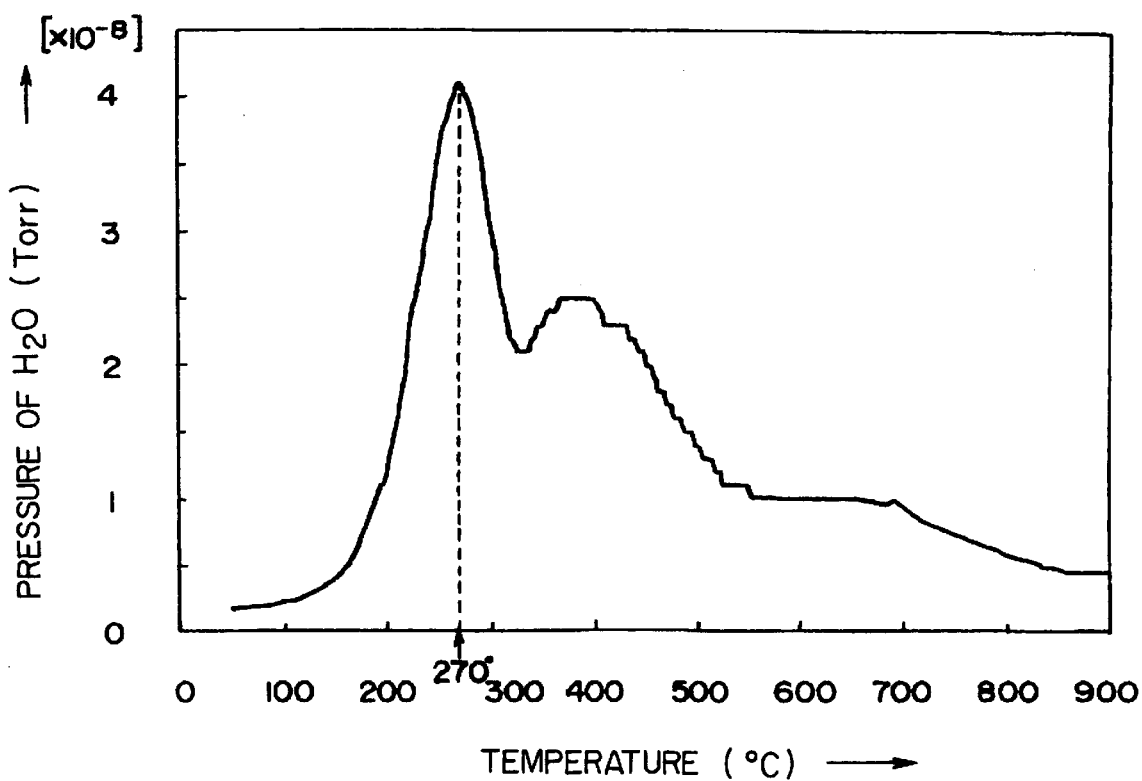
FIG. 4 is a graph showing temperature-dependency of volumes of moisture that has left a surface of an $SiO_2$ film by TEOS.

FIG. 3 is a graph showing temperature-dependency of volumes of hydrogen that has left the surface of the HSG poly-silicon film or the rugged poly-silicon film. FIG. 4 is a graph showing temperature-dependency of volumes of moisture that has left the surface of the $SiO_2$ film by TEOS;

As clearly seen from FIG. 3, if the temperature reaches 400° C. or higher, the volume of the leaving hydrogen is increased sharply, and the state may become more active. Thus, if the temperature of the poly-silicon film is set below 400° C., it may be seen that natural oxide films tend not to attach.

In addition, as clearly seen from FIG. 4, the temperature of the $SiO_2$ film by TEOS reaches 270° C. (about 300° C.), $H_2O$ component in the film leaves (is degassed) the most. Thus, when the wafers are loaded, if the temperature of the processing container is set to about 300° C., much moisture may be squeezed from the layer insulation film 8. Thus, during the annealing process it can be prevented that the moisture reacts with the poly-silicon film and that the natural oxide films attach thereon.

Herein, phosphorus densities and sheet resistances are measured regarding a case wherein a semiconductor wafer is loaded at 300° C. and another case wherein a semiconductor wafer is conventionally loaded at 400° C. The result is shown in FIG. 5.

As clearly seen from FIG. 5, if the wafer is loaded at 300° C. according to the invention, the phosphorus density after the annealing process becomes about $1.5 \times 10^{20}$ [atms/cm³] which is much higher than $0.4 \times 10^{20}$ [atms/cm³] of the case wherein the wafer is loaded at 400° C. That is, it is seen that the sheet resistance is lowered so much and the performance is better.

In addition, in the method of the invention, the washing process for removing the natural oxide films or the like attached on the surface of the poly-silicon film is conducted before the annealing process. Thus, so much, during the annealing process, the phosphorus atoms can be efficiently doped in order to raise its density. FIG. 6 is a graph for evaluating effectiveness of the washing process. As shown in FIG. 6, if the washing process is not conducted, the phosphorus atoms can be hardly doped. However, if the washing process is conducted, a large amount of the phosphorus atoms can be doped to about $1.5 \times 10^{20}$ [atms/cm³]. That is, the effectiveness of the washing process could be confirmed.

Figure 7:
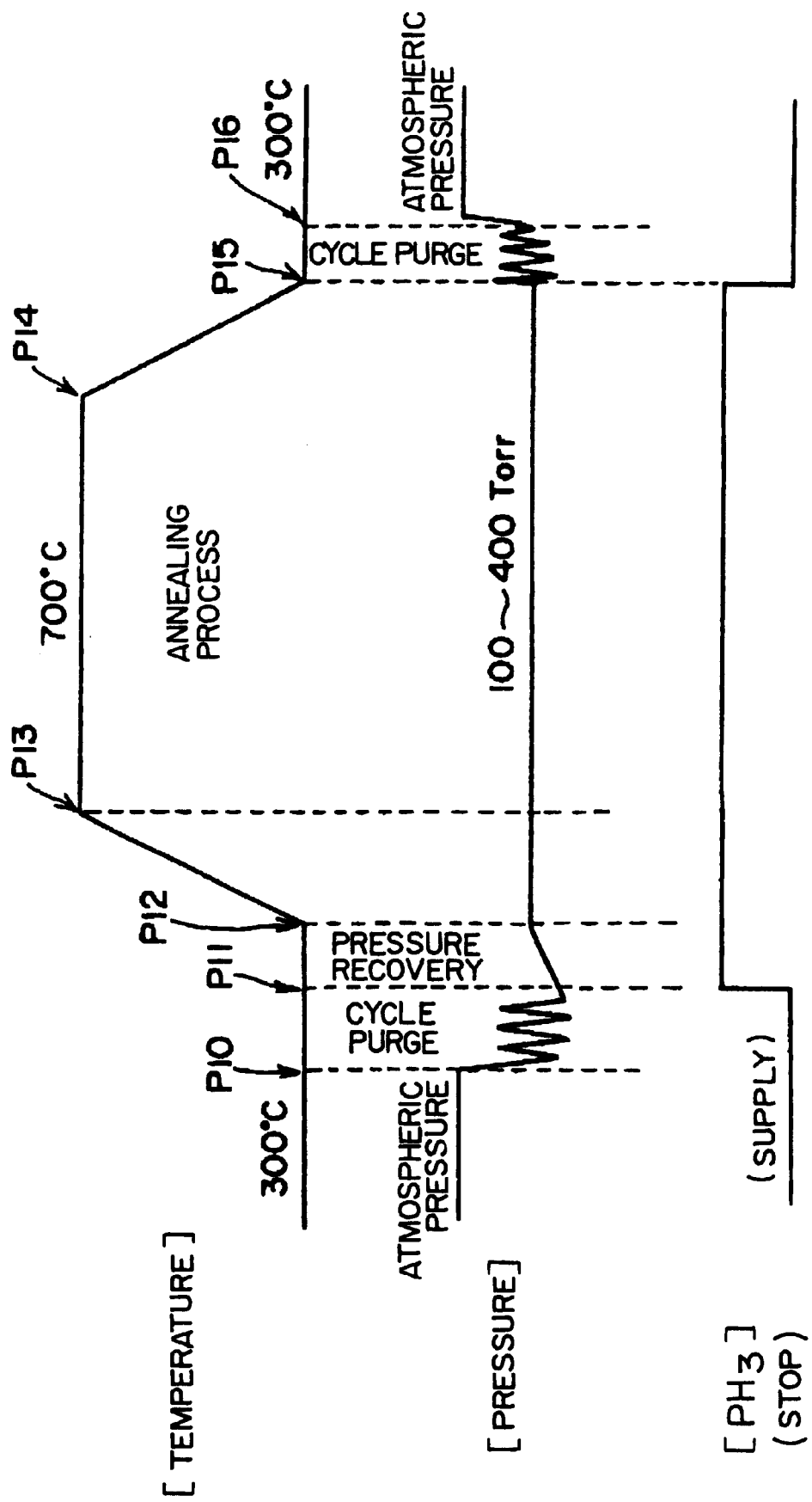
FIG. 7 is a time chart for explaining a second embodiment of a method of the invention.

Next, a second embodiment of the method of the invention is explained with reference to FIG. 7. FIG. 7 is a time chart for explaining the second embodiment of the method of the invention. Points of the second embodiment different from the first embodiment are that leaving (degassed) component such as moisture is sufficiently discharged by conducting a cycle-purge process of $N_2$ gas before the annealing process and that re-migration is prevented by preventing the pressure in the processing container from being lowered when the temperature of the wafers is raised or lowered.

That is, in the second example, immediately after the loading operation, wherein the wafers are loaded into the processing container that is heated to 300° C. and standing by, is completed (point P10), the cycle-purge process wherein the supply of $N_2$ gas and the discharge of the atmosphere gas are repeated in turn is carried out. Thus, the leaving component discharged from the layer insulation film 8 (see FIG. 9) can be efficiently discharged from the processing container. Thus, it can be prevented that the natural oxide films, which may cause trouble in doping the phosphorus atoms, attach on the poly-silicon film.

Then, after the cycle-purge process is completed (point P11), the supply of the $PH_3$ gas is started to recover the pressure in the processing container to a predetermined pressure, for example a process pressure of about 100 to 400 Torr (13300 to 53200 Pa). After the recovery of the pressure is completed as described above (point P12), the wafer temperature is raised to a process temperature, for example 700° C., while the process pressure is maintained. In general, if the HSG poly-silicon film or the rugged poly-silicon film is exposed to a high vacuum state of 500° C. or more, re-migration may occur so that the surface may be reduced to be out from the designed value. However, in the second embodiment, differently from the first embodiment wherein the state may temporarily be a high vacuum while heated, the $PH_3$ gas is previously supplied in order to maintain the high pressure of about 100 to 400 Torr while heated. Thus, it can be avoided that the re-migration is generated.

Then, if the wafer temperature is raised to 700° C. (point P13), an annealing process automatically starts for doping phosphorus atoms. The annealing process is conducted for a predetermined time. (At that time, a temperature recovering process may be conducted just before the annealing process.) After the annealing process is completed (point P14), the wafer temperature is lowered. At that time, differently from the first embodiment, the supply of the $PH_3$ gas is continued in order to maintain the pressure in the processing container at the range of 100 to 400 Torr until the wafer temperature is lowered to the waiting temperature i.e. 300° C. (point P15).

In the first embodiment, the cycle-purge process (between point P5 and point P6) is conducted while the wafer temperature is lowered. Thus, re-migration may be generated, and the phosphorus atoms that have been once doped may diffuse outside, to leave. However, in the second embodiment, the pressure in the processing container is maintained at the relatively high pressure i.e. about 100 to 400 Torr while the wafer temperature is lowered. Herein, it can be avoided that the re-migration occurs and/or the outside diffusion occurs.

Then, after the wafer temperature is sufficiently lowered (point P15), a cycle-purge process of $N_2$ gas is conducted (point P6) to recover the atmospheric pressure.

In the second embodiment, as described above, the cylce-purge process is conducted before the annealing process in order to surely discharge the leavable components from the TEOS layer insulation film. In addition, the re-migration is prevented while the wafer temperature is raised or lowered. Thus, the phosphorus atoms can be doped more efficiently, and electrical performance can be maintained as designed.

In addition, in the respective embodiments, the process pressure at the annealing process is maintained high i.e. at the range of 100 to 400 Torr. However, the process pressure may be maintained lower, for example at about 1 Torr (133 Pa).

The above embodiments are evaluated. The result is explained with reference to FIG. 8. FIG. 8 is a graph showing ratios of capacitance of a capacitor. In FIG. 8, performance A represents performance of the first embodiment (process pressure: 100 Torr). Performance B represents performance of the second embodiment (process pressure: 100 Torr). Performance C represents performance of a case wherein the process pressure is 1 Torr (other conditions are substantially the same as the first embodiment). Performance D represents performance of a case wherein the annealing process is not conducted. Herein, the ratio of the capacitance (Cmin/Cmax) means a ratio of the minimum capacitance (Cmin) with respect to the maximum capacitance (Cmax) while applied bias voltage is changed from +1 V to −1 V.

In the performance D, the ratio of the capacitance is about 45%. That is, changing rate is so high that the performance is not preferable. On the other hand, in the cases of the performances C, A and B, the ratios of the capacitance are about 70%, about 80% and about 96%, respectively. That is, changing rates are so low that the performances are preferable. Especially, in the case of the second embodiment shown in the performance B, the changing rate of the ratio of the capacitance is the lowest, so that the performance is very preferable.

In the above embodiments, the poly-silicon film whose surface has the irregular profile is formed on one electrode of the capacitor. However, of course, the invention is not limited to the embodiments.

The object to be processed is not limited to the semiconductor wafer. Of course, the invention can be applied to an LCD substrate, a glass substrate or the like.

As described above, according to the thermal processing method of the invention, following good effects can be achieved.

At first, by using the $PH_3$ gas as a doping gas and by setting the temperature of the thermal process at the range of 550 to 750° C., change of the impurity density may be prevented and doping efficiency of the phosphorus may be maintained high. This may generate less depletion layers and prevent the change of the capacitance of the capacitor.

By setting the temperature in the processing container at a temperature lower than 400° C. when loading the object to be processed, it can be prevented that natural oxide films are generated.

If the cycle-purge process by the inert gas is conducted before the temperature of the object to be processed is raised, the leaving (degassed) components such as moisture can be removed so surely that attachment of natural oxide films can be prevented more effectively.

By filling the inside of the processing container with the doping gas to maintain the pressure therein at the predetermined high pressure while the temperature of the object to be processed is raised, it can be prevented that re-migration is generated.

If the process pressure is maintained high i.e. at a range of about 100 to 400 Torr, doping efficiency of phosphorus atoms can be improved more.

By maintaining the pressure in the processing container at the predetermined process with the doping gas while the temperature of the object to be processed is lowered, it can be prevented that re-migration is generated.

What is claimed is:

1. A thermal processing method comprising:
  a loading step of loading an object to be processed into a processing container, the object having a surface provided with a silicon film having an irregular profile, and
  a doping step of introducing phosphorus atoms in the silicon film as impurities, by using $PH_3$ gas as a doping gas while maintaining a temperature of 550 to 750° C., wherein
  the loading step includes a step of setting a temperature in the processing container at a temperature lower than 400° C.

2. A thermal processing method according to claim 1, wherein:
  the silicon film having the irregular profile is an HSG poly-silicon film.

3. A thermal processing method according to claim 1, wherein:
  the silicon film having the irregular profile is a poly-silicon film.

4. A thermal processing method according to claim 1, further comprising a step of using the silicon film, into which the phosphorus atoms have been introduced by the doping step, as a portion of an electrode of a capacitor, after the doping step.

5. A thermal processing method comprising:
  a loading step of loading an object to be processed into a processing container, the object having a surface provided with a silicon film having an irregular profile, and
  a doping step of introducing phosphorus atoms in the silicon film as impurities, by using $PH_3$ gas as a doping gas while maintaining a temperature of 550 to 750° C.

a temperature raising step of raising a temperature in the processing container to a range of 550 to 750° C., between the loading step and the doping step, and a step of subjecting the object to be processed to a cycle-purge process, between the loading step and the temperature raising step.

6. A thermal processing method comprising a loading step of loading an object to be processed into a processing container, the object having a surface provided with a silicon film having an irregular profile, and a doping step of introducing phosphorus atoms in the silicon film as impurities, by using $PH_3$ gas as a doping gas while maintaining a temperature of 550 to 750° C., a temperature raising step of raising a temperature in the processing container to a range of 550 to 750° C., between the loading step and the doping step, and a step of supplying the doping gas into the processing container to a predetermined pressure, between the loading step and the temperature raising step.

7. A thermal processing method comprising:

a loading step of loading an object to be processed into a processing container, the object having a surface provided with a silicon film having an irregular profile, and a doping step of introducing phosphorus atoms in the silicon film as impurities, by using $PH_3$ gas as a doping gas while maintaining a temperature of 550 to 750° C., wherein the doping step includes a step of maintaining a pressure in the processing container at a range of 100 to 400 Torr.

8. A thermal processing method comprising:

a loading step of loading an object to be processed into a processing container, the object having a surface provided with a silicon film having an irregular profile, a doping step of introducing phosphorus atoms in the silicon film as impurities, by using $PH_3$ gas as a doping gas while maintaining a temperature of 550 to 750° C., and a temperature lowering step of lowering the temperature in the processing container to a predetermined temperature while continuing to supply the doping gas and maintaining a pressure in the processing container at a predetermined pressure.

* * * * *